US010782750B1

(12) United States Patent
Chen et al.

(10) Patent No.: US 10,782,750 B1
(45) Date of Patent: Sep. 22, 2020

(54) REMOTE INTAKE FOR FAN MODULE

(71) Applicant: QUANTA COMPUTER INC., Taoyuan (TW)

(72) Inventors: Chao-Jung Chen, Taoyuan (TW); Yu-Nien Huang, Taoyuan (TW); Ching-Yu Chen, Taoyuan (TW); Yu-Jou Ho, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/392,012

(22) Filed: Apr. 23, 2019

(51) Int. Cl.
*G06F 1/20* (2006.01)
*H05K 7/20* (2006.01)
*F04D 29/58* (2006.01)
*F04D 29/54* (2006.01)

(52) U.S. Cl.
CPC ............. *G06F 1/20* (2013.01); *F04D 29/547* (2013.01); *F04D 29/582* (2013.01); *H05K 7/20145* (2013.01); *H05K 7/20172* (2013.01); *G06F 2200/201* (2013.01)

(58) Field of Classification Search
CPC ..... H01L 23/467; H01L 23/427; F04D 17/16; F04D 25/0613; F04D 29/4226; F04D 29/281; F04D 29/703; F04D 29/424; F04D 29/4213; F04D 19/002; F04D 25/14; F04D 25/08; F04D 29/30; F04D 29/4206; F04D 29/582; F04D 29/665; F04D 25/06; H05K 7/20145; H05K 7/20972; H05K 7/20136; H05K 7/20154; H05K 7/20172; H05K 7/20181
See application file for complete search history.

(56) References Cited

U.S. PATENT DOCUMENTS

| 4,866,320 | A | * | 9/1989 | Schulz | F04D 25/082 310/89 |
| 5,297,005 | A | | 3/1994 | Gourdine | |
| 5,597,035 | A | * | 1/1997 | Smith | G06F 1/20 165/147 |
| 5,987,908 | A | * | 11/1999 | Wetzel | F24F 1/027 62/259.1 |
| 6,236,565 | B1 | * | 5/2001 | Gordon | H01L 23/467 174/16.1 |
| 2002/0159232 | A1 | * | 10/2002 | Beitelmal | G06F 1/20 361/695 |

(Continued)

FOREIGN PATENT DOCUMENTS

| TW | M505789 U | 7/2015 |
| TW | M567396 U | 9/2018 |

*Primary Examiner* — Adam B Dravininkas
(74) *Attorney, Agent, or Firm* — Nixon Peabody LLP

(57) ABSTRACT

The present disclosure describes an intake system for a fan module within a computer system. The intake system includes a cowling positioned in line with an intake path of the fan module. The cowling is configured to direct air into the fan module. The system further includes a remote intake that has a remote inlet, a remote outlet, and a remote conduit. The remote inlet is configured to intake air from around an element that is within the computer system and outside of the intake path of the fan module. The remote outlet is configured to discharge the air from the remote inlet into the intake path of the fan module. The remote conduit is configured to transport the air from the remote inlet to the remote outlet.

19 Claims, 16 Drawing Sheets

(56) References Cited

U.S. PATENT DOCUMENTS

| | | | | |
|---|---|---|---|---|
| 2003/0235033 | A1* | 12/2003 | Hutchinson | H01L 23/467 361/679.48 |
| 2004/0196629 | A1* | 10/2004 | Broder | G06F 1/20 361/695 |
| 2004/0240175 | A1* | 12/2004 | Brovald | G06F 1/20 361/679.5 |
| 2005/0219813 | A1* | 10/2005 | Cravens | H01L 23/467 361/690 |
| 2007/0236882 | A1* | 10/2007 | Chen | H05K 7/20154 361/695 |
| 2009/0034309 | A1* | 2/2009 | Ibori | H02M 7/003 363/141 |
| 2011/0299240 | A1 | 12/2011 | Kimura et al. | |
| 2011/0304976 | A1* | 12/2011 | Knopf | G06F 1/181 361/679.47 |
| 2013/0180220 | A1* | 7/2013 | McAuliffe | F04D 29/701 55/385.2 |
| 2016/0198593 | A1* | 7/2016 | Schmitt | H05K 7/20745 361/679.49 |

* cited by examiner

REMOTE INTAKE FOR FAN MODULE

FIELD OF THE INVENTION

The present invention relates to cooling computer systems and more specifically, to a remote intake port for cooling low airflow regions within computer systems.

BACKGROUND

Cooling is important for maintaining optimal performance of components within computer systems. One or more fans within the computer systems direct air through the chassis to cool the components. However, low airflow regions exist within the chassis. These regions exist for various reasons, such as components blocking the airflow or the geometry of the chassis. Further, the desire to maximize the space within computer systems further causes low airflow regions. Accordingly, components within the low airflow regions may overheat. Overheating may cause a decrease in performance or may damage or destroy the components in severe situations.

FIG. 1A illustrates a perspective view of a portion 100 of a chassis of a computer system housing an element 102 that needs to be cooled. The element 102 can be, for example, a processor, a chipset, or any other element within a computer system that generates heat. The element 102 is attached to a heat sink 104 that assists in dissipating the generated heat. The portion 100 of the chassis includes a fan module 106 that includes fans 108. The fans 108 generate airflow through the portion 100. The airflow assists in dissipating heat generated by elements within the computer system, such as the element 102.

FIG. 1B illustrates a side view of the portion 100 of FIG. 1A and includes arrows 110a and 110b illustrating the airflow through the portion 100. Airflow represented by the arrows 110a is directed towards the fan module 106. This airflow is generally within the intake path 107 of the fan module 106. The intake path 107 extends-out parallel to the axis 108a of the fans 108, within the fan module 106. The intake path 107 accounts for a majority of the air that passes through the fan module 106. Airflow represented by the arrows 110b is outside of the intake path 107. This air can still pass through the fan module 106 but is outside of the intake path 107.

The arrangement of the fan module 106 within the portion 100 generates a low airflow region 105. The arrows 110a and 110b illustrate the low airflow region 105 by not passing through the low airflow region 105. This low airflow region 105 has low airflow primarily because the region 105 is outside the intake path 107 of fan module 106. In particular, the low airflow region 105 is below the fan module 106 and downstream from the leading edge 106a of the fan module 106. The result is that heat may build up in the element 102 because the element 102 and the heat sink 104 are not experiencing enough airflow to dissipate generated heat. The failure to dissipate the heat can cause issues in the element 102, such as preventing certain elements from being placed at the location of the element 102.

In some situations, the airflow within the low airflow region 105 may be reduced even further because of other components within the portion 100 that block the airflow. Such other components can be, for example, a structural component that blocks the heat sink 104 and element 102.

Accordingly, there is a need for a way to improve airflow in low airflow regions in computer systems.

SUMMARY

According to one embodiment, an intake system for a fan module within a computer system is disclosed. The intake system includes a cowling positioned within an intake path of the fan module. The cowling is configured to direct air into the fan module. The intake system further includes a remote intake having a remote inlet, a remote outlet, and a remote conduit. The remote inlet is configured to intake air from around an element that is within the computer system and outside of the intake path of the fan module. The remote outlet is configured to discharge the air from the remote inlet into the intake path of the fan module. The remote conduit is configured to transport the air from the remote inlet to the remote outlet.

According to aspects of the embodiment, the cowling can have a cowling inlet configured to intake air along the intake path, and a cowling outlet configured to discharge air into a fan of the fan module. The cowling inlet can have a bell-shape. The remote outlet and the cowling outlet can discharge air parallel to the intake path. The area of the remote outlet can be less than, more than, or the same area as the cowling outlet. The remote conduit can at least partially define a surface of the cowling. The remote outlet can be configured to discharge air into the cowling by the remote outlet being an aperture in the cowling. The remote outlet can be configured to discharge air into a fan of the fan module. The intake system can have two or more of the remote intake. The two or more of the remote intake can be a pair of the remote intake that are configured to intake air from around elements on opposite sides of the cowling. The remote outlet can be configured to discharge air parallel to the direction of the intake path. The remote inlet can be configured to at least partially cover the element. The remote conduit can have a curved geometry; such being S-shaped. The cowling and the remote outlet can be flush against the fan module.

According to another embodiment, a remote intake for a fan module within a computer system is disclosed. The remote intake includes a remote inlet configured to intake air from around an element that is within the computer system and outside of an intake path of the fan module. The remote intake further includes a remote outlet configured to discharge the air from the remote inlet into the intake path of the fan module. The remote intake further includes a remote conduit configured to transport the air from the remote inlet to the remote outlet.

According to aspects of the embodiment, the remote outlet can be configured to discharge the air into a fan of the fan module. The remote outlet can be configured to discharge the air parallel to the intake path. The remote inlet can be configured to at least partially cover the element. The remote conduit can have a curved geometry; such being S-shaped.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments and are, therefore, not to be considered as limitations on the scope of the various embodiments or claims.

DETAILED DESCRIPTION

Figure 1A:
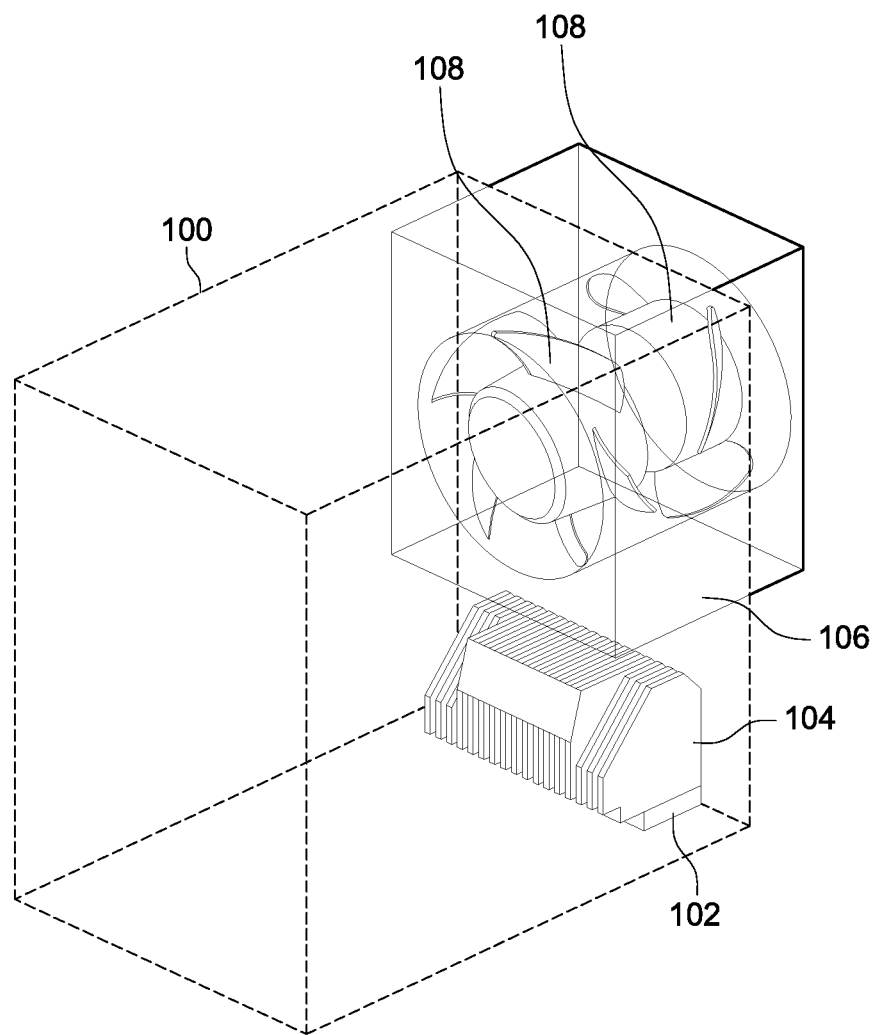
FIG. 1A illustrates a perspective view of a portion of a computer system.

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the terms "computing device" or "computing system" or "computer system" refer to any electronically-powered or battery-powered equipment that has hardware, software, and/or firmware components, where the software and/or firmware components can be configured for operating features on the device. The term "operating environment" can refer to any operating system or environment that functions to allow software to run on a computer system.

The present disclosure describes a remote intake that can be used within a computer system to increase the airflow within low airflow regions of the computer system. The remote intake includes an inlet and an outlet. The inlet is positioned within the low airflow region of the computer system. The outlet is positioned at a fan module of the computer system. The remote intake includes a conduit that transports air between the inlet and the outlet. As a result of the remote intake, airflow can be increased at the low airflow regions. Thus, computer elements at the low airflow regions can be sufficiently cooled. Further, with the remote intake, computer elements may be positioned in computer systems where previously unable because of low airflow.

The present disclosure also describes intake systems. The systems include a cowling that is positioned at a fan module within the computer system. One or more remote intakes, as described above, are combined with the cowling to increase the airflow within low airflow regions of the computer system. The remote intakes can be the same size and shape, or different sizes and shapes, depending on the arrangement of the low airflow regions within the computer system. Use of the remote intakes or intake systems within a computer system can increase the available space to place computer elements by increasing the space within the computer systems that can be cooled.

Figure 1B:
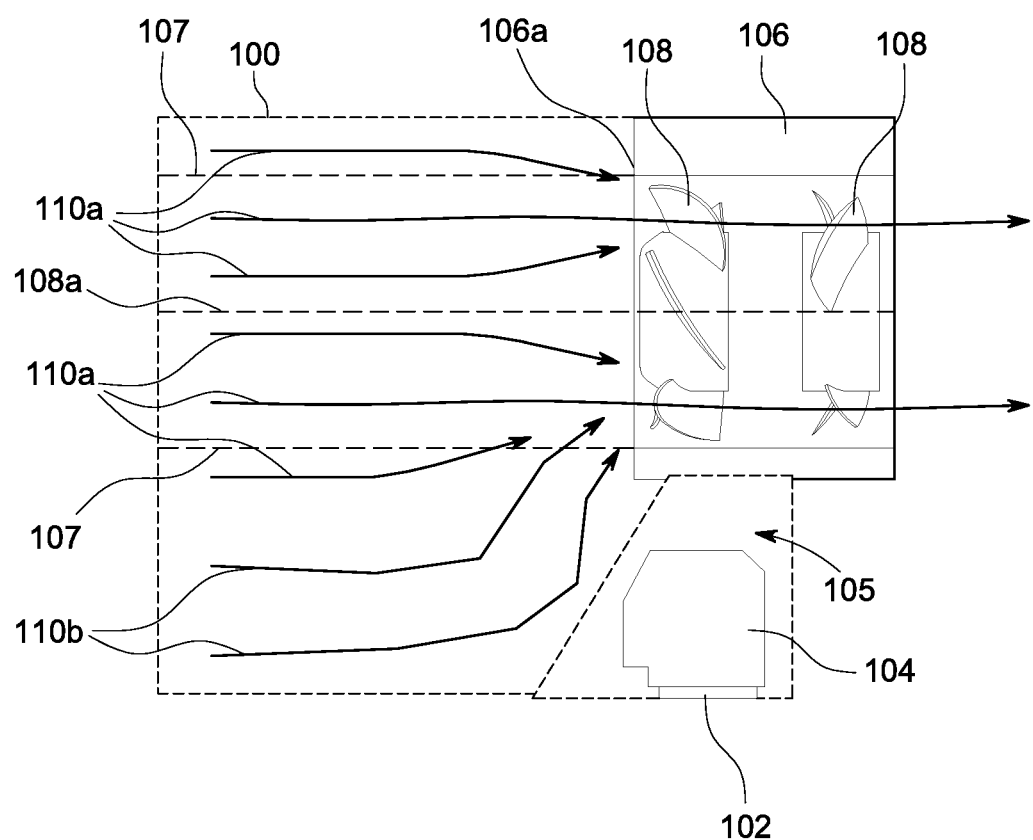
FIG. 1B illustrates a side view of the portion in FIG. 1A.
Figure 2A:
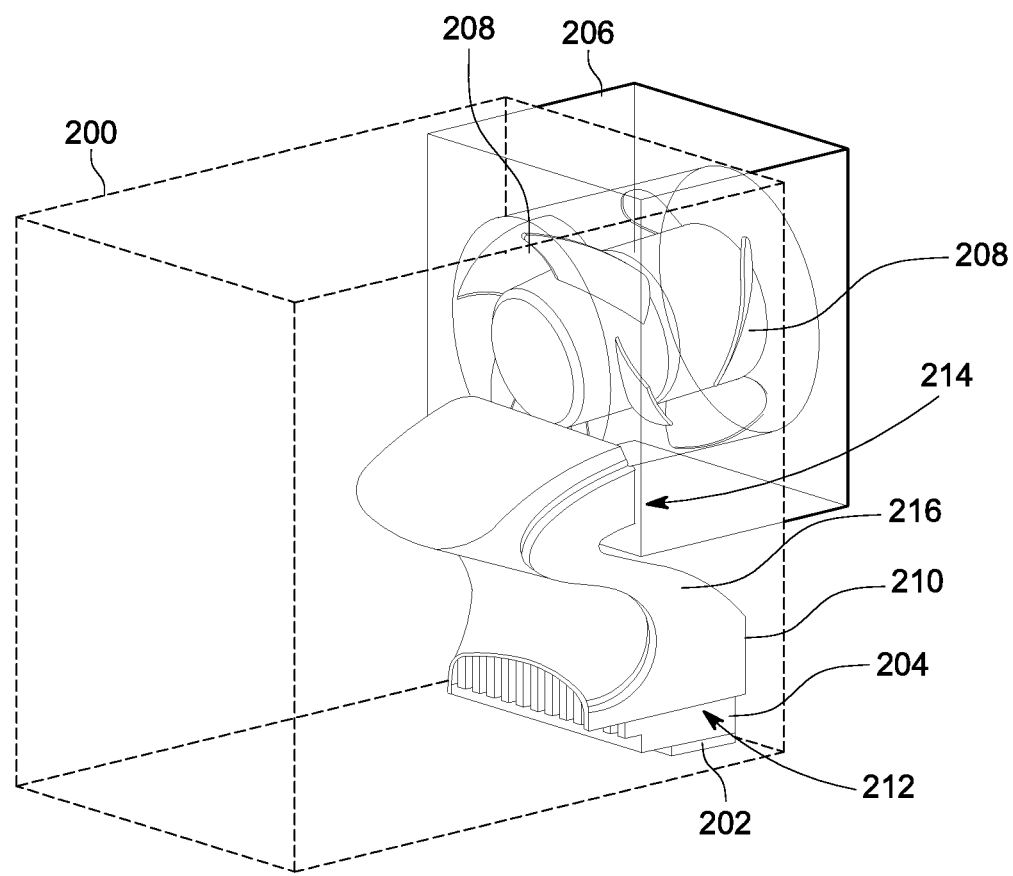
FIG. 2A illustrates a perspective view of a portion of a computer system with a remote intake, according to an embodiment of the present disclosure.

FIG. 2A illustrates a perspective view of a portion 200 of a computer system with a remote intake 210, according to an embodiment of the present disclosure. Although the portion 200 is disclosed as a "portion," the portion 200 represents the computer system as a whole (e.g., computer system 200) rather than only a portion therein. The portion 200 includes an element 202, a heat sink 204, and a fan module 206 with fans 208, similar to the features discussed above with respect to FIGS. 1A and 1B. In addition, the portion 200 includes the remote intake 210.

The remote intake 210 is configured to increase airflow at low airflow regions of the portion 200. For example, the portion 200 may include a similar low airflow region as the low airflow region 105 within the portion 100 illustrated in FIG. 1B. The similarity of the low airflow regions is based on a similar arrangement of the fan module 206, the element 202, and the heat sink 204. The remote intake 210, therefore, is configured and arranged within the portion 200 to collect air surrounding the element 202 and the heat sink 204, and discharge the air into the fan module 206. As a result, the remote intake 210 can increase the airflow surrounding the element 202 and the heat sink 204.

Figure 2B:
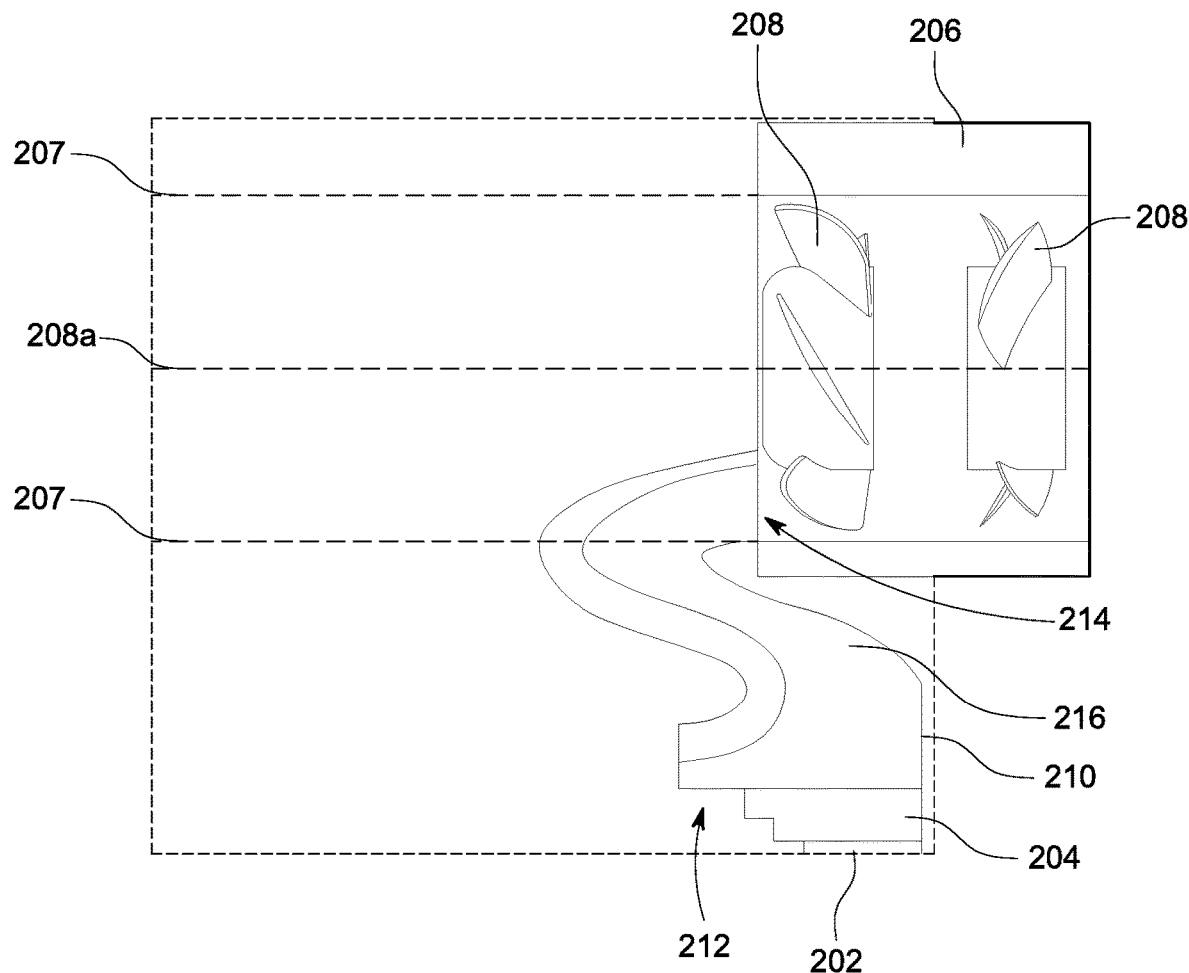
FIG. 2B illustrates a side view of the portion of FIG. 2A, according to an embodiment of the present disclosure.

The remote intake 210 has a remote inlet 212 configured to intake air from outside of the intake path 207 of the fan module 206. Referring to FIG. 2B, the intake path 207 of the fan module 206 generally extends-out parallel to the axis 208a of the fans 208. The intake path 207 is generally about the diameter of the fans 208 at the fan module 206, but can increase gradually away from the fan module 206. Thus, because the element 202 and the heat sink 204 are directly below the fan module 206, the element 202 and the heat sink 204 are outside of the intake path 207. With the remote inlet 212 at the element 202 and the heat sink 204, the remote inlet 212 can intake air surrounding the element 202 and the heat sink 204 to increase the airflow around the element 202. In turn, this increases heat dissipation, as discussed further below.

The remote intake 210 further includes a remote outlet 214 configured to discharge the air from the remote inlet 212. In one or more embodiments, the remote outlet 214 can be configured to discharge the air anywhere along the intake path 207 of the fan module 206. In one or more embodiments, and as illustrated in FIG. 2B, the remote outlet 214 can abut the leading edge 206a of the fan module 206. The remote outlet 214 discharges the air from the remote inlet 212 directly into the fans 208 of the fan module 206. Specifically, the remote outlet 214 can be positioned within the intake path 207 and against the fan module 206 so that air discharged from the remote outlet 214 goes into the fans 208.

The remote intake 210 further includes a remote conduit 216. The remote conduit 216 is configured to transport the air from the remote inlet 212 to the remote outlet 214. The remote conduit 216 can be any shape that connects the remote inlet 212 to the remote outlet 214. Preferably, the remote conduit 216 has a curved geometry—rather than sharp corners—to assist in transporting the air from the remote inlet 212 to the remote outlet 214 with a more laminar flow. In one or more embodiments, and as illustrated in FIGS. 2A and 2B, the remote conduit 216 can have an S-shape. However, the shape and the size of the remote conduit 216 can vary depending on the locations of the remote inlet 212 and the remote outlet 214.

As discussed above, the remote outlet 214 can abut against the leading edge 206a of the fan module 206. The closer the remote outlet 214 is to the leading edge 206a of the fan module 206, the greater the negative air pressure that is created at the remote inlet 212, which further increases the airflow across the element 202 and the heat sink 204.

As shown in FIG. 2B, in one or more embodiments, the remote inlet 212 is configured to at least partially cover the heat sink 204 above the element 202. By at least partially covering the heat sink 204, the remote inlet 212 can increase the airflow over the heat sink 204 and around the element 202. This can increase the cooling of the element 202 and the heat sink 204 by the fan module 206.

In one or more embodiments, the remote inlet 212 can have a flat profile. Alternatively, the remote inlet 212 can have various profiles, shapes, or sizes to match the geometry of the element 102 that it is configured to cool, to match the geometry of the heat sink 204, or to match the geometry of the portion 100 of the computer which it is in.

In one or more embodiments, the size of the remote outlet 214 compared to the diameter of the fans 208 can be based on the cooling amount required for the element 202, the cooling efficiency of the heat sink 204, or both. The larger the cooling requirement or the smaller the efficiency, than the larger the remote outlet 214 that is needed to cool the element 202. The area that the remote inlet 212 is supposed to cover can also affect the size and shape of the remote outlet 214. The larger the area, the larger the remote outlet 214 compared to the size of the fans 208.

Figure 3A:
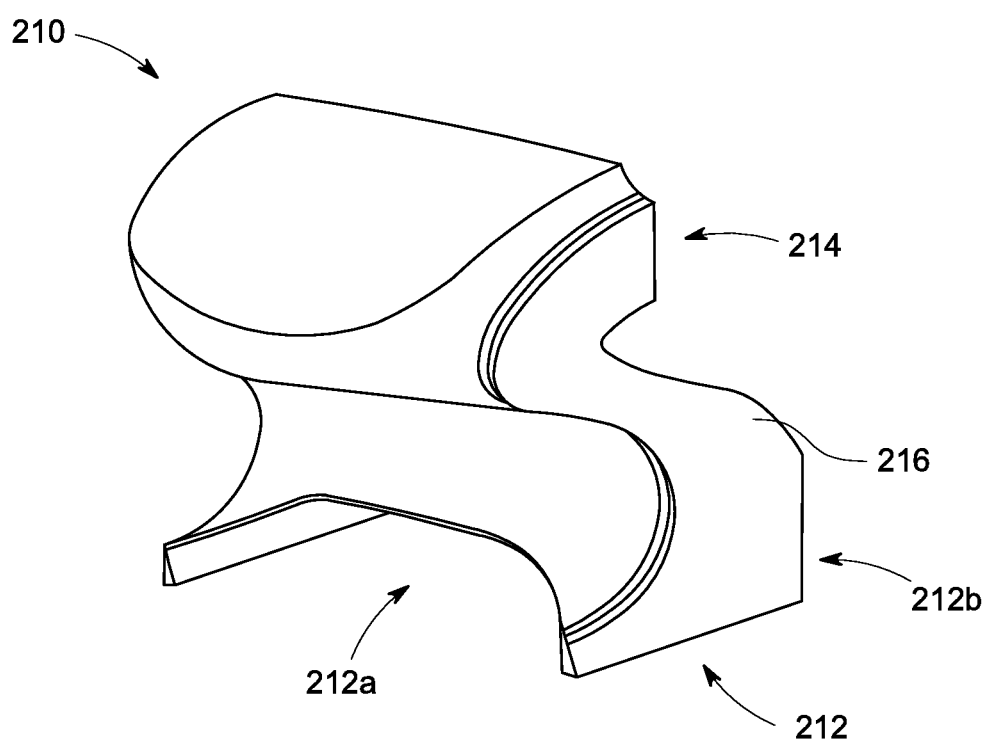
FIG. 3A illustrates a perspective view of a remote intake, according to an embodiment of the present disclosure.
Figure 3B:
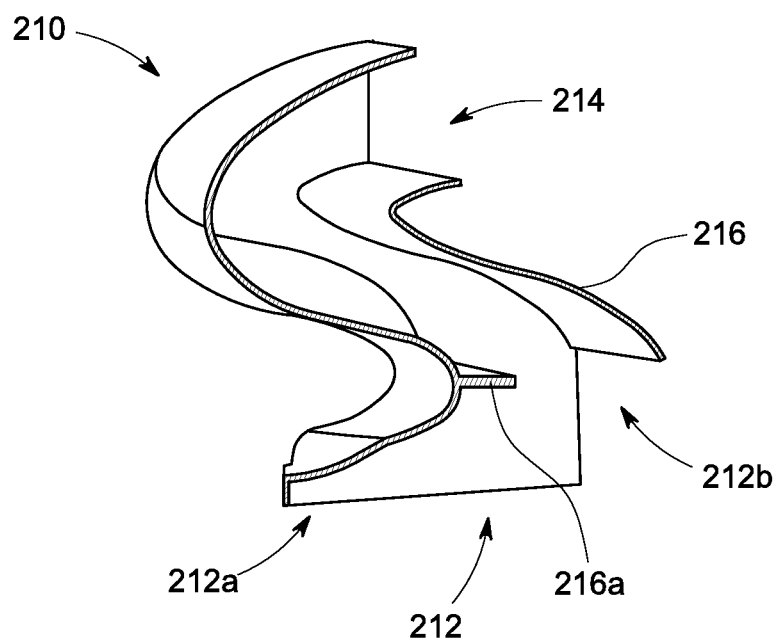
FIG. 3B illustrates a sliced-perspective view of the remote intake of FIG. 3A, according to an embodiment of the present disclosure.

FIG. 3A illustrates a perspective view of the remote intake 210, according to an embodiment of the present disclosure. FIG. 3B illustrates a sliced perspective view of the remote intake 210, according to an embodiment of the present disclosure. In one or more embodiments, the remote inlet 212 can include a front side opening 212a. The front side opening 212a is configured to allow air to pass into the remote inlet 212 parallel to the direction of the intake path 207 of the fan module 206 (FIG. 2B). The front side opening 212a of the remote inlet 212 can increase airflow over the element 202 (FIG. 2B) as compared to, for example, a remote inlet with a flat profile.

In one or more embodiments, the remote inlet 212 can further include a back side opening 212b. The back side opening 212b can further increase airflow around the element 202 as compared to, for example, a remote inlet with a flat profile. The back side opening 212b is configured to allow the remote inlet 212 to be positioned around the element 202 and the heat sink 204 in a corner of the portion 200 of the computer system.

The shape or profile of the remote inlet 212 with the front side opening 212a and the back side opening 212b can be, in part, to increase the airflow around the element 202 and the heat sink 204 (FIG. 2B). The shape or profile can also allow the remote inlet 212 to be positioned as needed within the portion 200 (FIG. 2A) of the computer system.

As illustrated in FIG. 3B, in one or more embodiments, the remote conduit 216 of the remote intake 210 can include a projection 216a. The projection 216a can provide structural rigidity for the remote intake 210. Alternatively, or in addition, the projection 216a can aid in guiding air through the remote intake 210 to increase the airflow through the remote intake 210.

Figure 4A:
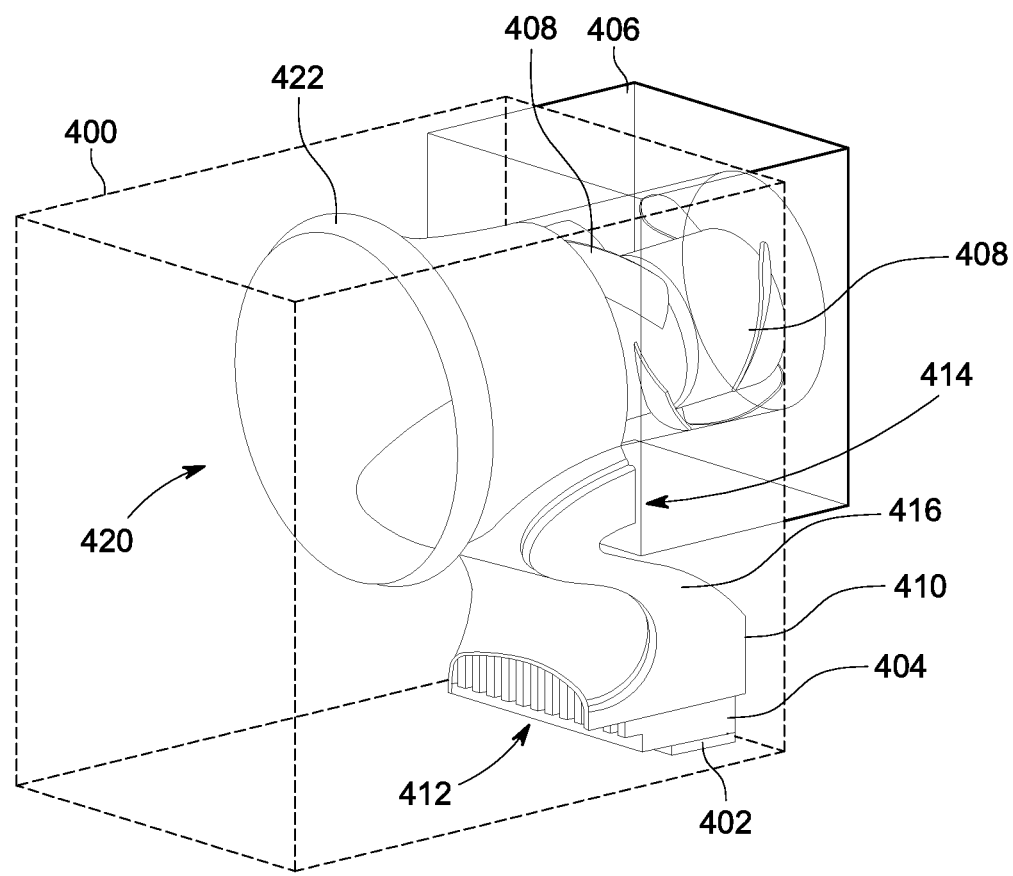
FIG. 4A illustrates a perspective view of a portion of a computer system with an intake system, according to an embodiment of the present disclosure.
Figure 4B:
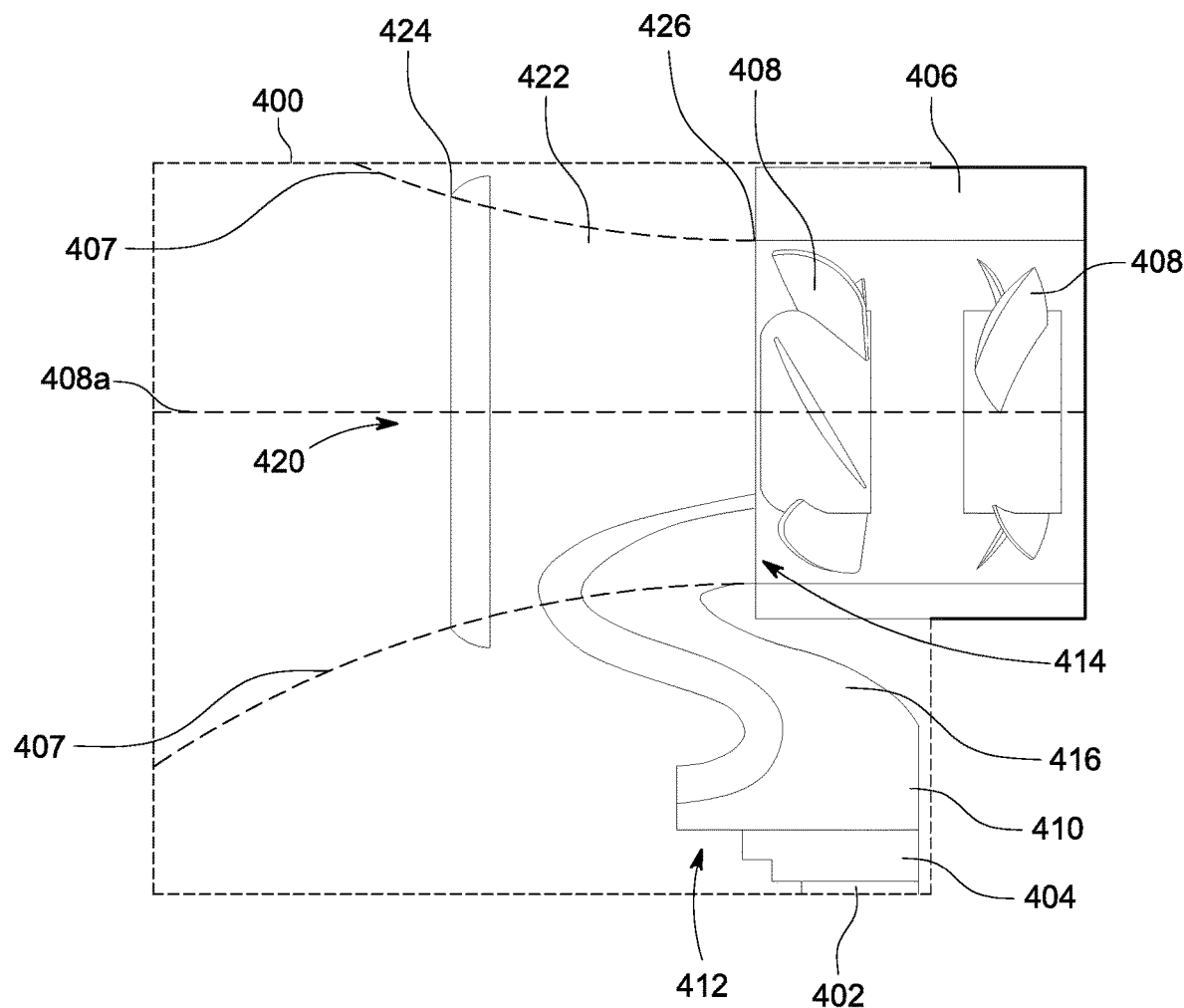
FIG. 4B illustrates a side view of the portion of FIG. 4A, according to an embodiment of the present disclosure.
Figure 5A:
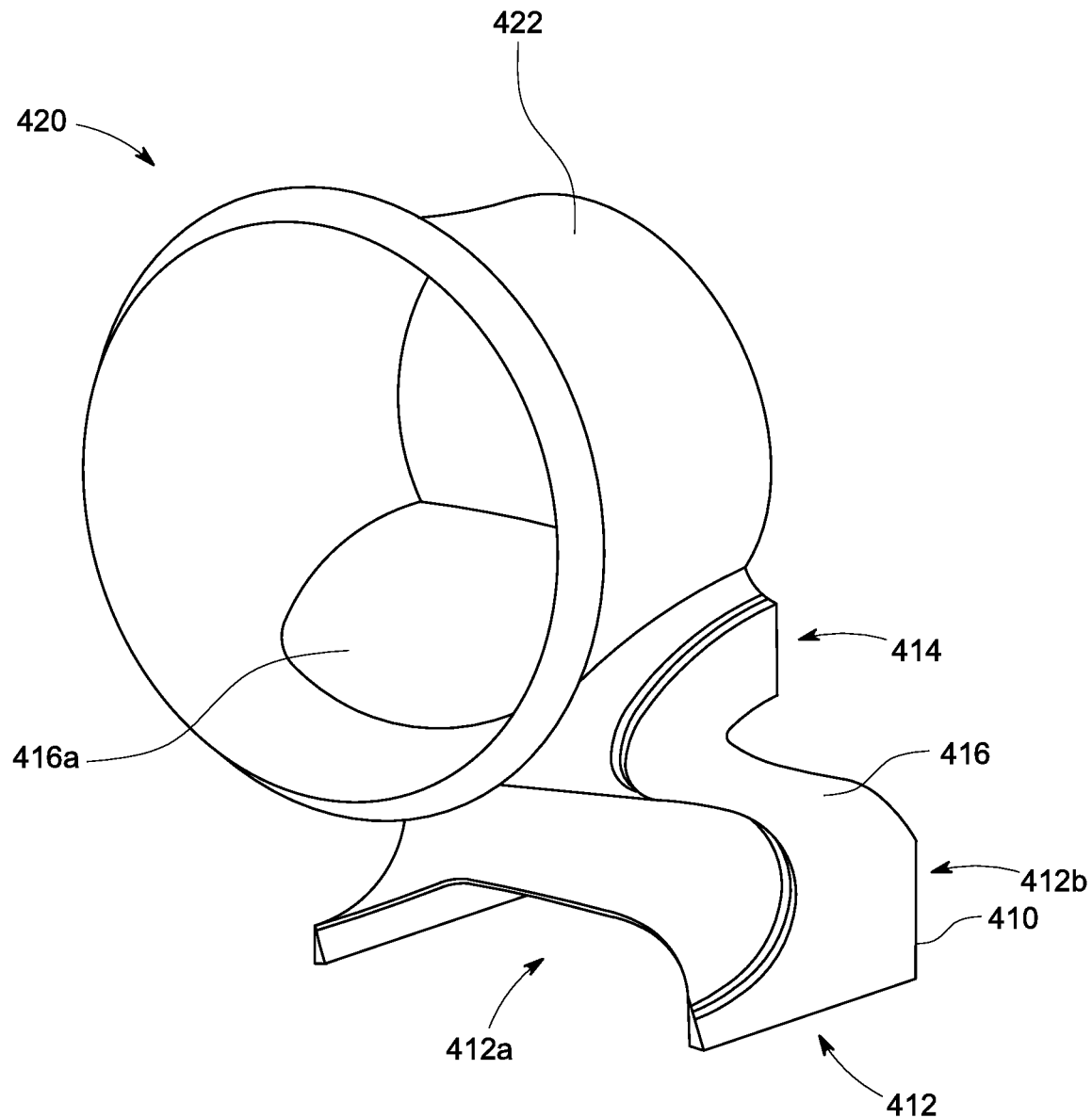
FIG. 5A illustrates a perspective view of an intake system, according to an embodiment of the present disclosure.
Figure 5B:
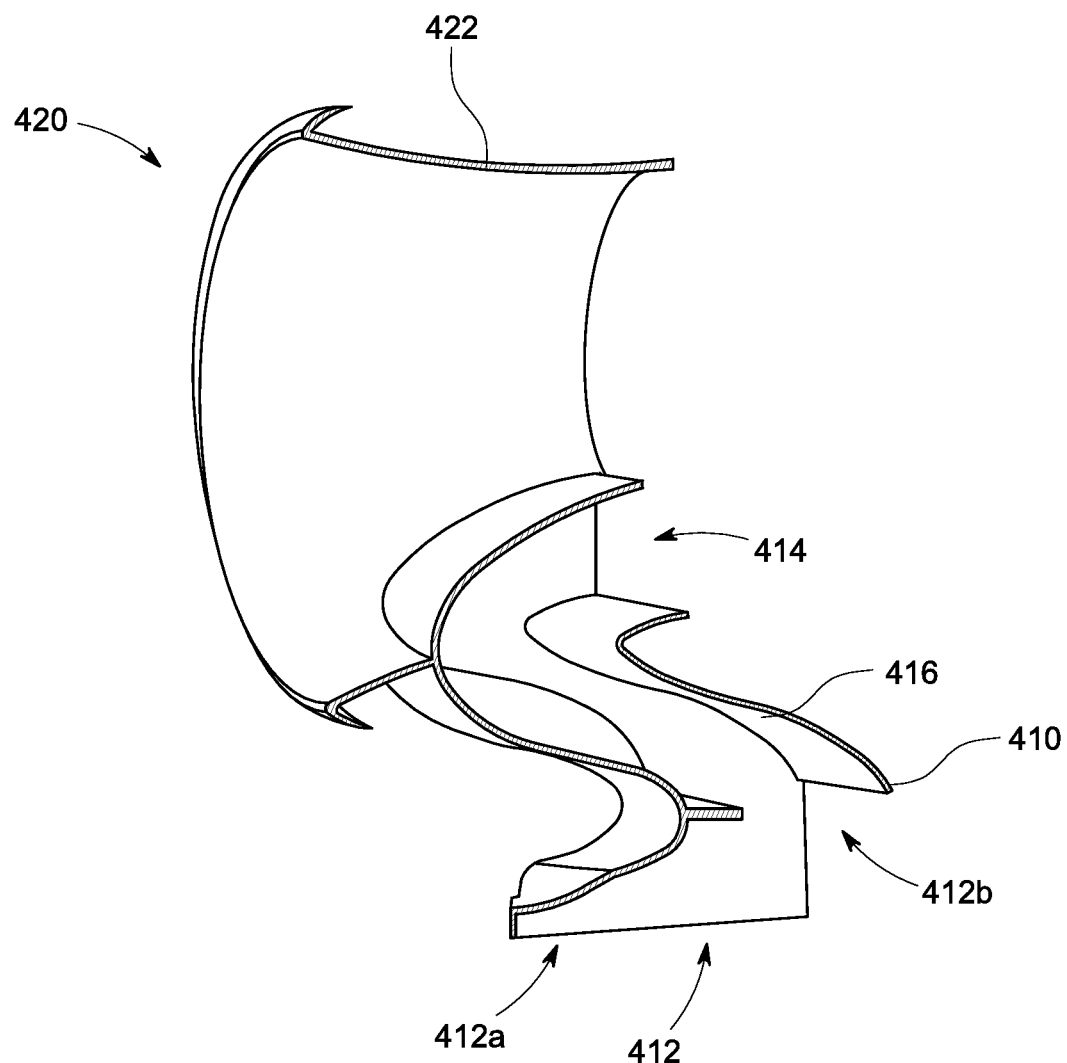
FIG. 5B illustrates a sliced-perspective view of the intake system of FIG. 5A, according to an embodiment of the present disclosure.

An intake system 420 according to the present disclosure will now be described in reference to FIGS. 4A-5B. FIG. 4A illustrates a perspective view of a portion 400 of a computer system with the intake system 420, according to an embodiment of the present disclosure. FIG. 4B illustrates a side view of the portion 400 of FIG. 4A, according to an embodiment of the present disclosure. FIG. 5A illustrates a perspective view of the intake system 420, according to an embodiment of the present disclosure. FIG. 5B illustrates a sliced perspective view of the intake system 420, according to an embodiment of the present disclosure.

The portion 400 includes similar components as the portion 200 described above, including the element 402 to be cooled; the heat sink 404 above the element 402; and the fan module 406 with the fans 408 and associated axis 408a of the fans 408. The intake system 420 includes a remote intake 410 that is similar to the remote intake 210 described above (FIGS. 2A-3B). Accordingly, similarly numbered elements of the portion 400 and the remote intake 410 are as described above with respect to the components of the portion 200 and the remote intake 210, such as the remote inlet 412 with the front side opening 412a and the back side opening 412b.

The intake system 420 further includes a cowling 422. The cowling 422 provides for more directed airflow through the portion 400 according to the intake path 407. The cowling 422 is positioned against the fan module 406 and within the intake path 407 (FIG. 4B) of the fan module 406. The cowling 422 is configured to direct air into the fan module 406. The cowling 422 can have various shapes. In one or more embodiments, the cowling 422 can be in the general shape of a bell. The general shape of a bell assists in expanding the intake path 407, as illustrated by the diverging lines representing the intake path 407 upwind from the fan module 406, and guiding the air into the fan module 406.

The cowling 422 has a cowling inlet 424 that is configured to intake air. The cowling 422 further has a cowling outlet 426 that is configured to discharge air into the fans 408 of the fan module 406. In one or more embodiments, the diameter of the cowling outlet 426 can vary, as further discussed below. In some embodiments, the diameter of the cowling outlet 426 can be about the same diameter as the diameter of the fans 408.

Referring to FIG. 5A, in one or more embodiments, a portion 416a of the remote conduit 416 can extend into the cowling 422 such that a volume of the cowling 422 is reduced by the portion 416a of the remote conduit 416. With the portion 416a of the remote conduit 416 extending into the cowling 422, the diameter of the cowling 422 can match the diameter of the fans 408. However, both the cowling outlet 426 and the remote outlet 414 can be positioned to be within the intake path 407 of the fan module 406, as illustrated in FIG. 4B. In one or more alternative embodiments, the remote outlet 414 can be below the cowling 422 such that the remote conduit 416 does not extend into the cowling 422. In such embodiments, the diameter of the cowling outlet 426 is smaller than the diameter of the fans 408 to provide room for the remote outlet 414 below the cowling outlet 426 to discharge air into the fans 408.

In one or more embodiments, the size of the remote outlet 414 compared to the cowling outlet 426 can be based on the cooling amount required for the element 402, the cooling efficiency of the heat sink 404, or both. The larger the cooling requirement or the smaller the efficiency, than the larger the remote outlet 414 that is needed to cool the element 402. The area that the remote inlet 412 is supposed to cover can also affect the size and shape of the remote outlet 414. The larger the area, the larger the remote outlet 414 compared to the size of the cowling outlet 426.

In one or more embodiments, the cowling outlet 426 can be flush with the remote outlet 414, as illustrated in FIGS. 4B and 5B. Such an arrangement allows the cowling outlet 426 and the remote outlet 414 to be against the fan module 406. However, in one or more embodiments, the cowling outlet 426 can be upwind or downwind relative to the remote outlet 414.

Figure 6A:
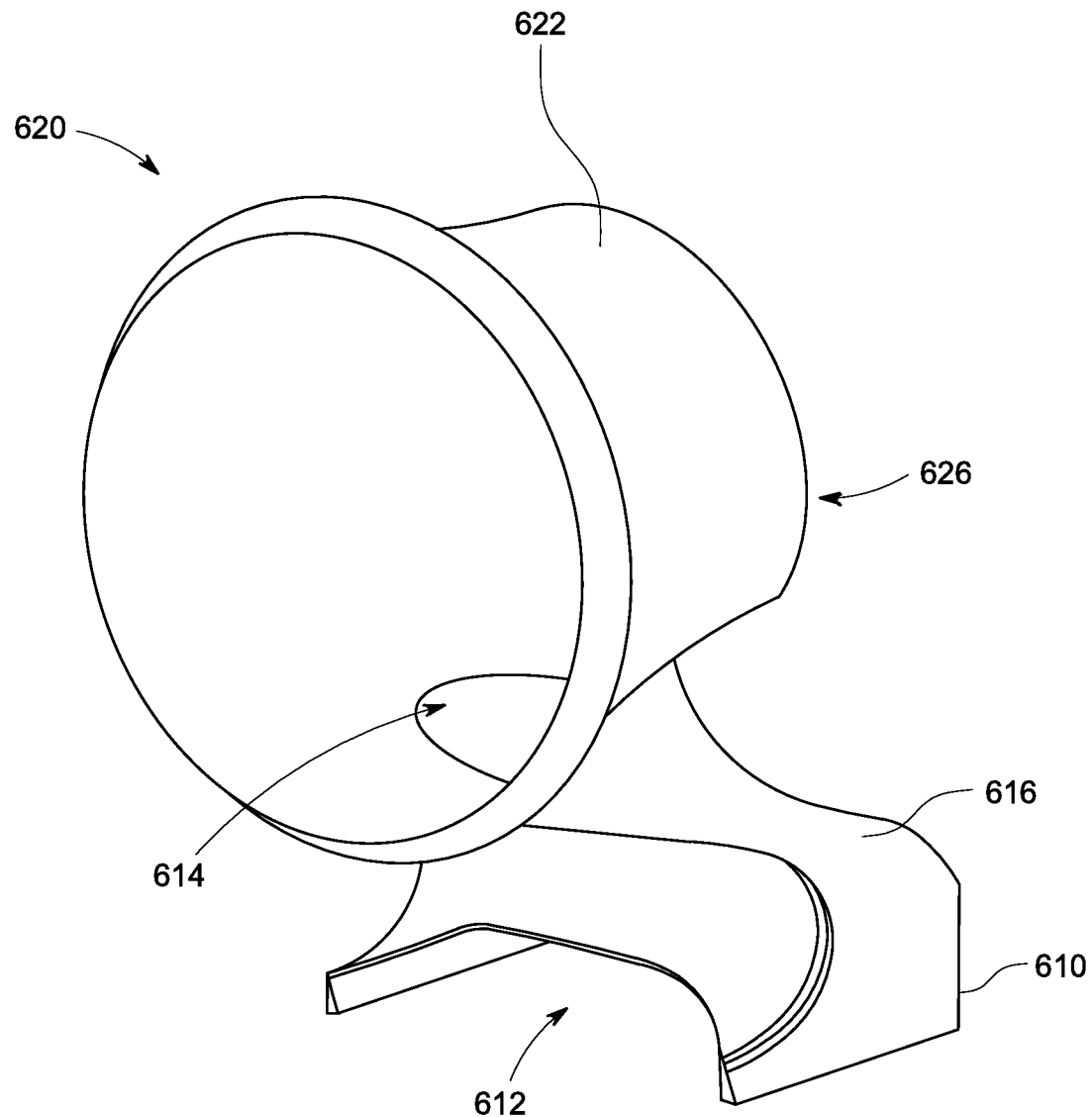
FIG. 6A illustrates a perspective view of another intake system, according to an embodiment of the present disclosure.
Figure 6B:
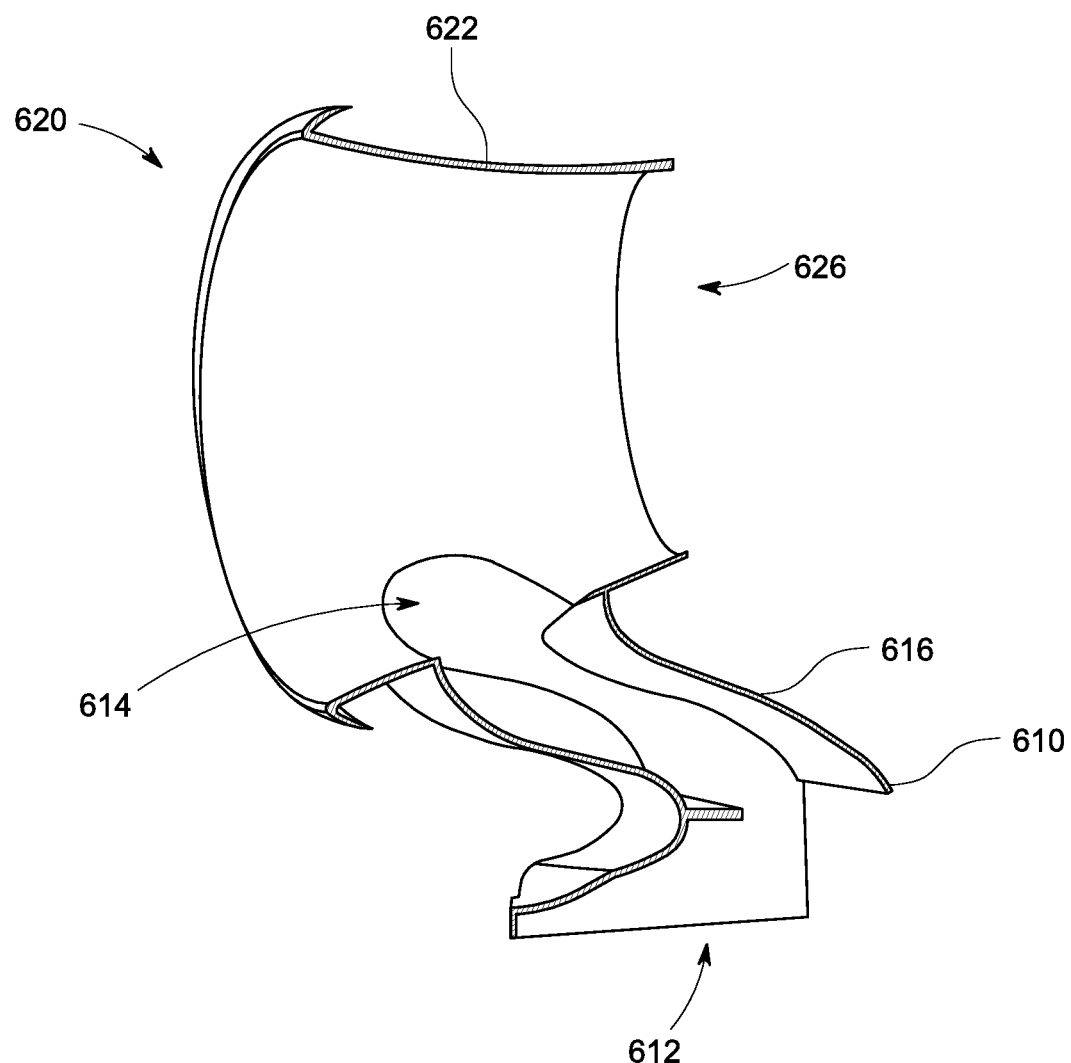
FIG. 6B illustrates a sliced-perspective perspective view of the intake system of FIG. 6A, according to an embodiment of the present disclosure.

An alternative intake system 620 of the present disclosure is described with respect to FIGS. 6A and 6B. FIG. 6A illustrates a perspective view of the intake system 620, according to an embodiment of the present disclosure. FIG. 6B illustrates a sliced perspective view of the intake system 620, according to an embodiment of the present disclosure. The intake system 620 is similar to the intake system 420 (FIG. 5B). Accordingly, similarly numbered elements of the intake system 620 are as described above with respect to the elements of the intake system 420. However, the remote outlet 614 of the remote intake 610 is configured to discharge air into the cowling 422 (FIG. 5B), rather than into a fan module.

As illustrated in FIGS. 6A and 6B, the remote outlet 614 can be an aperture within the cowling 422. The remote conduit 616 can extend up to, but stop at, the cowling 622. Air from the remote inlet 612 passes through the remote conduit 616 and is discharged from the remote outlet 614 into the cowling 622. From there, the air is mixed with air from the cowling 622 and is discharged into a fan module. The diameter of the cowling outlet 626 of the intake system 620 can be the same diameter as fans (e.g., fans 408 of FIG. 4A) within a fan module (e.g., 406 of FIG. 4A) against which the intake system 620 abuts.

Figure 7A:
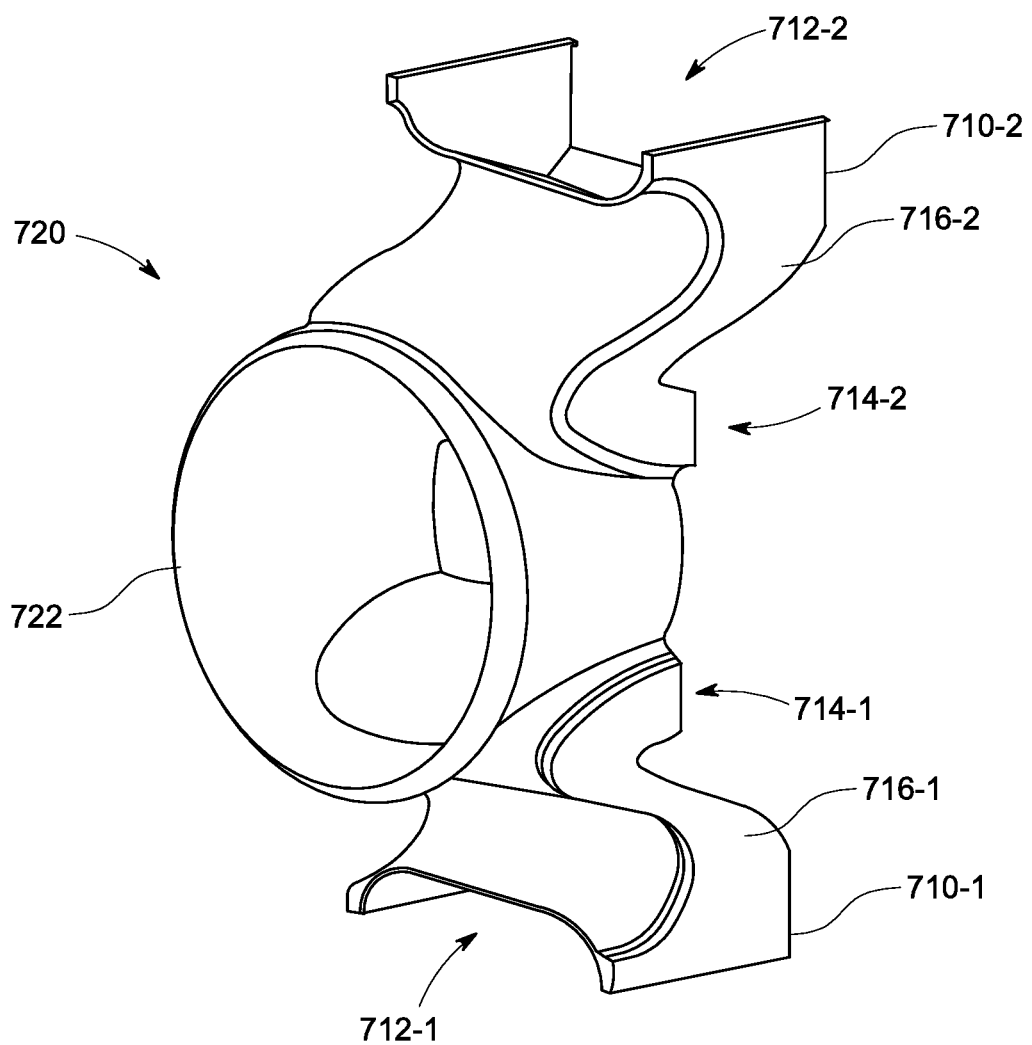
FIG. 7A illustrates a perspective view of another intake system, according to an embodiment of the present disclosure.
Figure 7B:
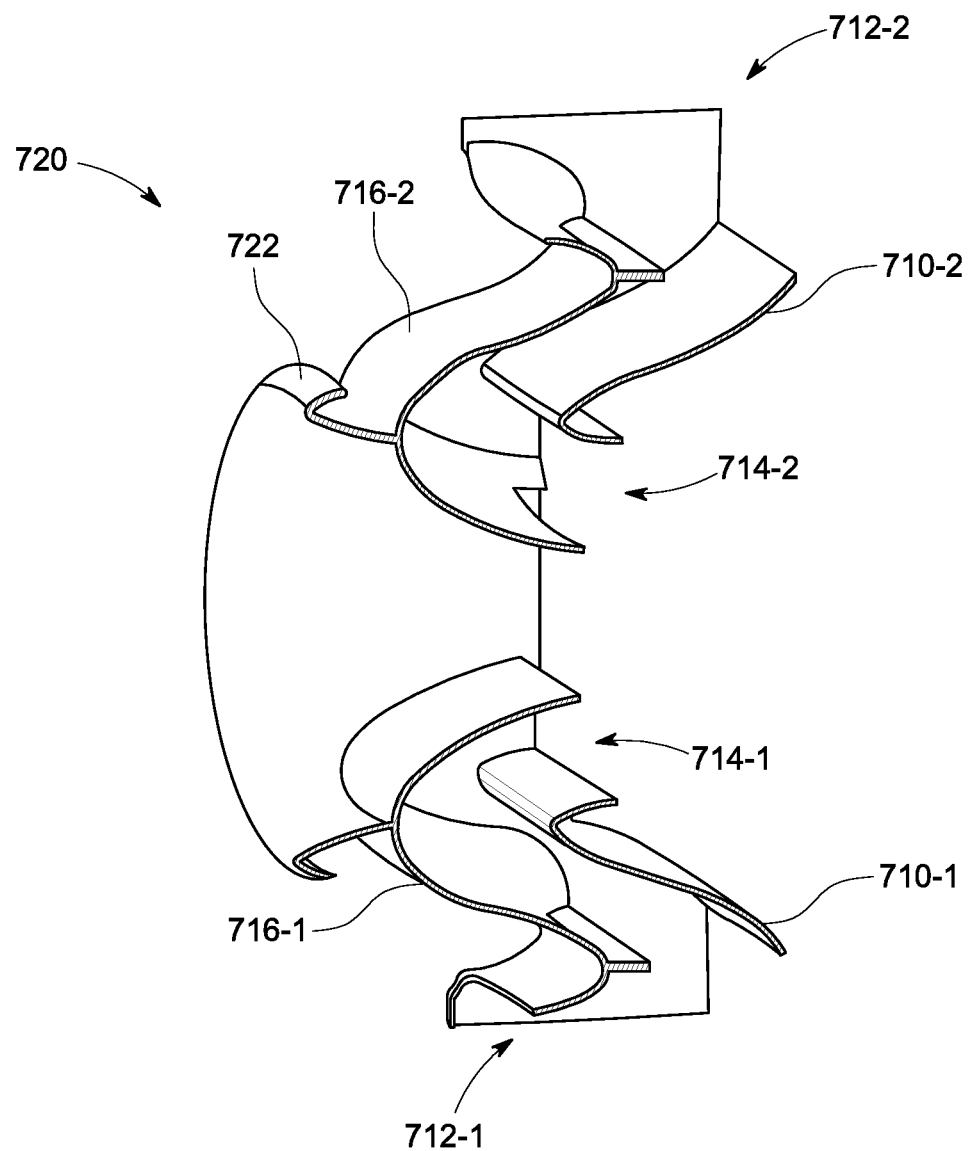
FIG. 7B illustrates a sliced-perspective perspective view of the intake system of FIG. 7A, according to an embodiment of the present disclosure.

An alternative intake system 720 of the present disclosure is described with respect to FIGS. 7A and 7B. FIG. 7A illustrates a perspective view of the intake system 720, according to an embodiment of the present disclosure. FIG. 7B illustrates a sliced perspective view of the intake system 720, according to an embodiment of the present disclosure. The intake system 720 is similar to the intake system 420 (FIG. 5B). Accordingly, similarly numbered elements of the intake system 720 are as described above with respect to the elements of the intake system 420. However, the intake system 720 includes two of various elements discussed above, such as two remote intakes 710-1 and 710-2 with the corresponding remote inlets 712-1 and 712-2, remote outlets 714-1 and 714-2, and remote conduits 716-1 and 716-2. The two remote intakes 710-1 and 710-2 can be positioned so as to increase the airflow around two separate elements within a computer system. For example, and as illustrated in FIGS. 7A and 7B, the remote intakes 710-1 and 710-2 can be positioned on opposite sides of the cowling 722. This arrangement allows the remote intakes 710-1 and 710-2 to surround two elements within a computer system on opposite sides of the cowling 722.

The dimensions and shapes of the two remote intakes 710-1 and 710-2 can be the same, such as what is illustrated in FIGS. 7A and 7B. Alternatively, the dimensions, shapes, or both of the remote intakes 710-1 and 710-2 can be different. The differences can be as needed to reach different elements or areas within a computer system.

Although the remote intakes 710-1 and 710-2 are illustrated as being above and below the cowling 722, in one or more embodiments, the remote intakes 710-1 and 710-2 can be positioned according to any arrangement relative to the cowling 722. Further, although only two remote intakes 710-1 and 710-2 are shown, there can be more than two remote intakes 710 connected to the cowling 722 and arranged according to any arrangement to cool various elements within a computer system. For example, there can be three, four, five, or more remote intakes 710 around the cowling 722, to the extent that space for the remote intakes 710 is available.

Although the remote conduits 716-1 and 716-2 are illustrated as extending into the cowling 722, similar to the remote conduit 416 (FIG. 5B), in one or more embodiments, one or both of the remote intakes 710-1 and 710-2 can be configured according to the remote intake 610 (FIG. 6B). As such, one or both of the remote conduits 716-1 and 716-2 does not extend into the cowling 722. Instead, one or both of the remote outlets 714-1 and 714-2 can be configured as apertures within the cowling 722, such as the remote outlet 614 of the intake system 620 (FIG. 6B).

Figure 8:
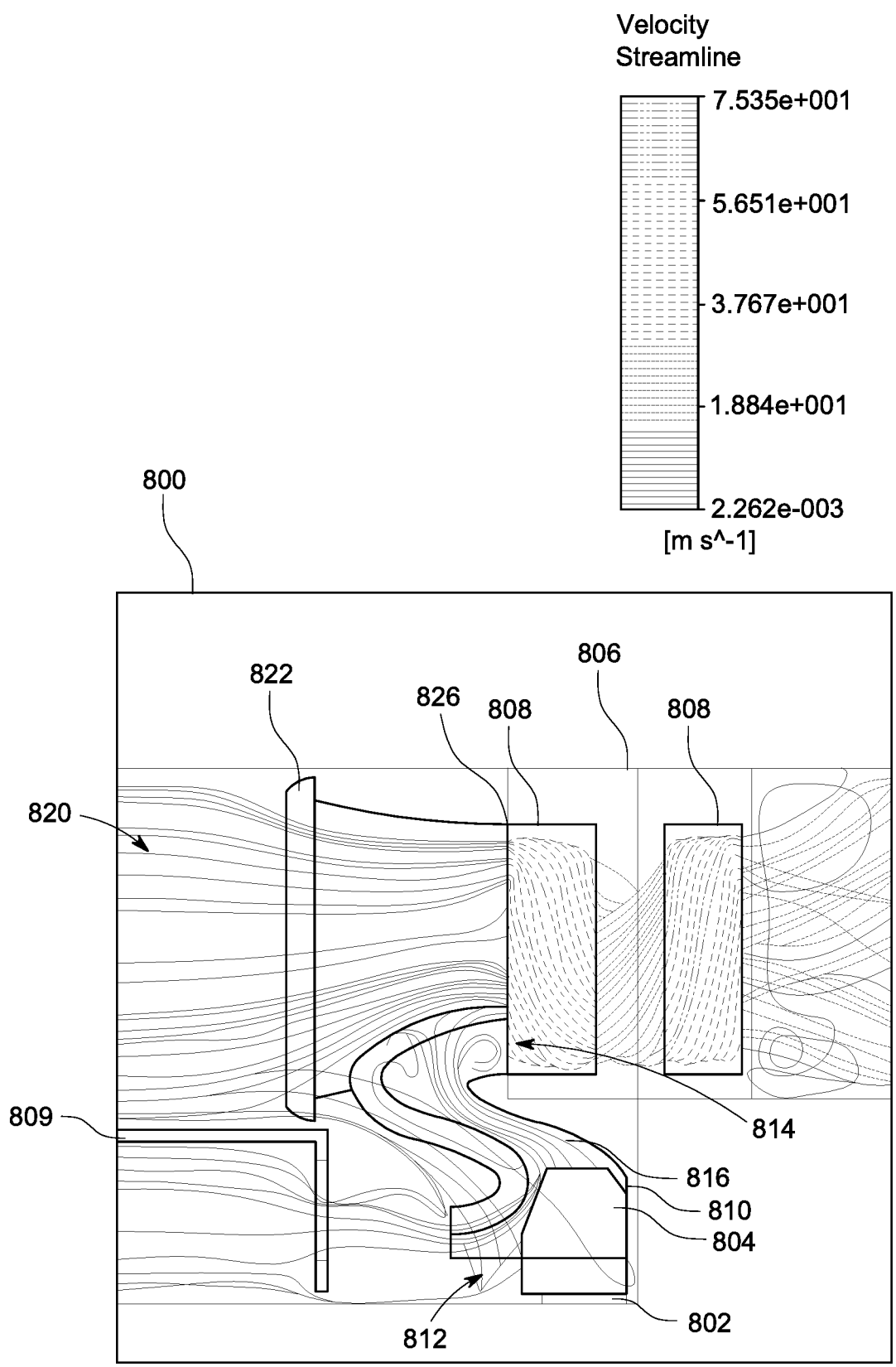
FIG. 8 illustrates a streamline plot of an intake system, according to an embodiment of the present disclosure.

FIG. 8 illustrates a pressure field plot of a portion 800 including an intake system 820, according to an embodiment of the present disclosure. The portion 800 and intake system 820 are similar to the portion 400 and the intake system 420 of FIGS. 4A and 4B. Accordingly, similarly numbered elements of the portion 800 and the intake system 820 are as described above with respect to the elements of the intake system 420.

The portion 800 includes the element 802, the heat sink 804, and the fan module 806 with the fans 808. The portion 800 further includes a bracket 809. The bracket 809 can be for structural rigidity of the chassis of the computer system at the portion 800. Alternatively, the bracket 809 can be for attaching components to the computer system within the portion 800. Regardless of its purpose, the bracket 809 may further reduce the amount of airflow that the element 802 and the heat sink 804 experience.

The intake system 820 includes the remote intake 810 connected to the cowling 822. The remote inlet 812 is above and partially surrounds the heat sink 804. The remote conduit 816 extends up from the remote inlet 812 to the remote outlet 814, which abuts the fan module 806 along with the cowling outlet 826 of the cowling 822.

As shown by the air velocities and corresponding legend, the air velocity over the heat sink 804 and the element 802 is about the same as the air velocity through the cowling 822. Accordingly, the combination of the cowling 822 and the remote intake 810 of the intake system 820 increases the airflow over the element 802 and the heat sink 804. The increased airflow increases the dissipation of heat generated by the element 802. The increased dissipation of heat allows for the element 802 to run cooler, which can increase performance of the element 802.

Figure 9:
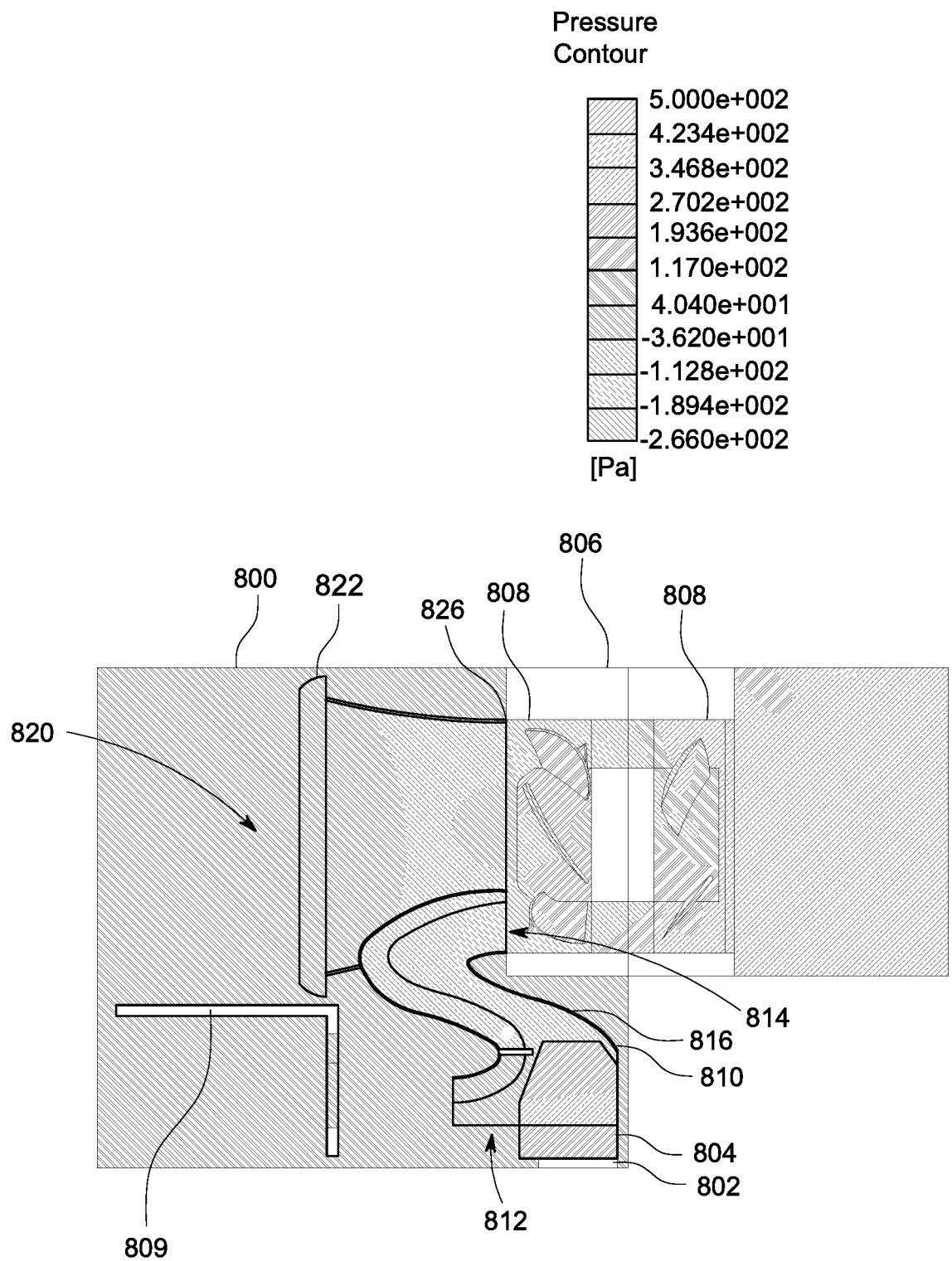
FIG. 9 illustrates a pressure field plot of the intake system of FIG. 8, according to an embodiment of the present disclosure.

FIG. 9 illustrates a pressure field plot of the intake system 820 of FIG. 8, according to an embodiment of the present disclosure. Because of the remote intake 810, the fans 808 are able to create low pressure around the heat sink 804 and the element 802. The low pressure causes air to be sucked from around the element 802 and into the fans 808 of the fan module.

The presence of the intake system of the present disclosure within a computer system allows for greater cooling of a chipset within a low airflow region. A comparison was done of the temperatures of a chipset both with and without the intake system of the present disclosure. For a 5-Watt chipset as the element (e.g., element 802 of FIG. 8) located under a fan module (e.g., fan module 806 of FIG. 8), the temperature of the chipset was measured to be about 47.7° C. at ambient conditions of 25° C. and a fan airflow rate of 50 cubic feet per minute (cfm). At the same conditions, but with the intake system of the present disclosure against the fan module and surrounding the chipset, the temperature of the chipset was measured to be about 42.4° C. Accordingly, the presence of the intake system increased the cooling, which amounted to a 23.3% increase in thermal performance.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. An intake system for a fan module within a computer system, the intake system comprising:
   a cowling positioned in line with an intake path of the fan module, the cowling configured to direct air into the fan module; and
   at least one remote intake having:
   a remote inlet configured to intake air from around an element that is within the computer system and outside of the intake path of the fan module; a remote outlet configured to discharge the air from the remote inlet into a fan of the fan module; and
   a remote conduit configured to transport the air from the remote inlet to the remote outlet;
   wherein a surface of the remote conduit at least partially defines a surface of the cowling.

2. The intake system of claim 1, wherein the cowling includes a cowling inlet configured to intake air along the intake path, and a cowling outlet configured to discharge air into a fan of the fan module.

3. The intake system of claim 2, wherein the cowling inlet is bell-shaped.

4. The intake system of claim 2, wherein the remote outlet and the cowling outlet are parallel to the intake path.

5. The intake system of claim 2, wherein the area of the remote outlet is less than the area of the cowling outlet.

6. The intake system of claim 1, wherein the at least one remote intake comprises two or more remote intakes.

7. The intake system of claim 6, wherein the two or more remote intakes comprise a pair of the remote intakes configured to intake air from around elements on opposite sides of the cowling.

8. The intake system of claim 1, wherein the remote outlet is configured to discharge air parallel to the direction of the intake path.

9. The intake system of claim 1, wherein the remote inlet is configured to at least partially cover the element.

10. The intake system of claim 1, wherein the remote conduit is S-shaped.

11. The intake system of claim 1, wherein the cowling and the remote outlet are flush against the fan module.

12. An intake system for a fan module within a computer system, the remote intake comprising:
- a cowling positioned in line with an intake path of the fan module, the cowling configured to direct air into the fan module; and
- at least one remote intake having:
  - a remote inlet configured to intake air from around an element that is within the computer system and outside of an intake path of the fan module;
  - a remote outlet configured to discharge the air from the remote inlet into the intake path of the fan module; and
  - a remote conduit configured to transport the air from the remote inlet to the remote outlet, wherein the remote outlet is an aperture in a side of the cowling between an inlet and an outlet of the cowling.

13. The intake system of claim 12, wherein the cowling inlet is bell-shaped.

14. The intake system of claim 12, wherein the remote outlet is configured to discharge the air perpendicular to the direction of the intake path.

15. The intake system of claim 12, wherein the remote inlet is configured to at least partially cover the element.

16. The intake system of claim 12, wherein the remote conduit is S-shaped.

17. The intake system of claim 12, wherein the cowling inlet is configured to intake air along the intake path, and the cowling outlet is configured to discharge air into a fan of the fan module.

18. The intake system of claim 17, wherein the area of the remote outlet is less than the area of the cowling outlet.

19. The intake system of claim 12, wherein the cowling is flush against the fan module.

* * * * *